(12) United States Patent
Hampton et al.

(10) Patent No.: US 10,170,895 B2
(45) Date of Patent: *Jan. 1, 2019

(54) CORONA IGNITION WITH SELF-TUNING POWER AMPLIFIER

(71) Applicant: Federal-Mogul Ignition Company, Southfield, MI (US)

(72) Inventors: Keith Hampton, Ann Arbor, MI (US); Alfred Permuy, Rueil-Malmaison (FR); John Antony Burrows, Altrincham (GB)

(73) Assignee: Tenneco Inc., Lake Forest, IL (US)

( * ) Notice: Subject to any disclaimer, the term of this patent is extended or adjusted under 35 U.S.C. 154(b) by 119 days.

This patent is subject to a terminal disclaimer.

(21) Appl. No.: 15/230,927

(22) Filed: Aug. 8, 2016

(65) Prior Publication Data

US 2016/0344166 A1 Nov. 24, 2016

Related U.S. Application Data

(63) Continuation-in-part of application No. 13/842,803, filed on Mar. 15, 2013, now Pat. No. 9,413,314, (Continued)

(51) Int. Cl.
*H01T 19/00* (2006.01)
*H01F 38/12* (2006.01)
(Continued)

(52) U.S. Cl.
CPC ............... *H01T 19/00* (2013.01); *F02P 3/01* (2013.01); *F02P 3/04* (2013.01); *F02P 9/002* (2013.01);
(Continued)

(58) Field of Classification Search
CPC ...... H03F 3/45076; H03F 3/21; H03F 1/0211; H01T 19/00; H01T 13/50; H01F 38/12;
(Continued)

(56) References Cited

U.S. PATENT DOCUMENTS 3,531,738 A  9/1970 Thakore
3,973,545 A  8/1976 Fischman et al.
(Continued)

FOREIGN PATENT DOCUMENTS

DE  102010045174 A1  3/2012
DE  102011052096 A1  3/2012
(Continued)

OTHER PUBLICATIONS

International Search Report, dated Nov. 9, 2017 (PCT/US2017/045820).
(Continued)

*Primary Examiner* — Jacob Amick
(74) *Attorney, Agent, or Firm* — Robert L. Stearn; Dickinson Wright, PLLC

(57) ABSTRACT

A power amplifier circuit for a corona ignition system is provided. The circuit includes an inductor and capacitor connected to one end of a secondary winding of an RF transformer. The other end of the secondary winding is connected to a current sensor which is connected to ground. The transformer also has a primary winding with one end connected to a voltage supply and the other end attached to a pair of switches. The windings are wound around a core. Current flowing from the DC voltage supply to the switches causes a magnetic flux in the core. A voltage is generated on the secondary winding by the current that flows through the igniter. This voltage is fed back to the switches, controlling on and off timing. Voltage is provided to the corona igniter or pulled from the igniter when the current traveling into or from the igniter is at zero.

17 Claims, 5 Drawing Sheets

Related U.S. Application Data which is a continuation-in-part of application No. 12/777,105, filed on May 10, 2010, now Pat. No. 8,578,902.

(60) Provisional application No. 61/298,442, filed on Jan. 26, 2010, provisional application No. 61/176,614, filed on May 8, 2009.

(51) Int. Cl.

| | |
|---|---|
| *H03F 3/21* | (2006.01) |
| *F02P 3/01* | (2006.01) |
| *F02P 3/04* | (2006.01) |
| *F02P 9/00* | (2006.01) |
| *F02P 23/04* | (2006.01) |
| *F23Q 3/00* | (2006.01) |
| *H01T 13/50* | (2006.01) |
| *H02M 7/538* | (2007.01) |
| *H03F 3/217* | (2006.01) |
| *F02P 17/00* | (2006.01) |

(52) U.S. Cl.
CPC .............. *F02P 23/04* (2013.01); *F23Q 3/004* (2013.01); *H01F 38/12* (2013.01); *H01T 13/50* (2013.01); *H02M 7/538* (2013.01); *H03F 3/21* (2013.01); *H03F 3/2173* (2013.01); *F02P 17/00* (2013.01); *H03F 2200/541* (2013.01); *Y02B 70/1441* (2013.01)

(58) Field of Classification Search
CPC . F23Q 3/004; F02P 9/002; F02P 23/04; F02P 3/01; F02P 3/04
See application file for complete search history.

(56) References Cited

U.S. PATENT DOCUMENTS

| | | | |
|---|---|---|---|
| 4,245,609 | A | 1/1981 | Gerry |
| 4,291,661 | A | 9/1981 | Gerry |
| 5,224,015 | A | 6/1993 | Balland |
| 5,317,155 | A | 5/1994 | King |
| 9,413,314 | B2 * | 8/2016 | Hampton ................. F02P 9/002 |
| 2004/0129241 | A1 | 7/2004 | Freen |
| 2010/0147239 | A1 | 6/2010 | Lu et al. |
| 2010/0282198 | A1 | 11/2010 | Hampton et al. |
| 2012/0055430 | A1 | 3/2012 | Braeuchle |
| 2012/0055455 | A1 | 3/2012 | Ruan et al. |
| 2012/0055456 | A1 | 3/2012 | Mueller |
| 2012/0249006 | A1 | 10/2012 | Burrows |

FOREIGN PATENT DOCUMENTS

| | | |
|---|---|---|
| DE | 102010062305 A1 | 6/2012 |
| EP | 0491589 A1 | 6/1992 |
| EP | 2199597 A2 | 6/2010 |
| WO | 2012138676 A1 | 10/2012 |
| WO | 2014149661 A1 | 9/2014 |

OTHER PUBLICATIONS

Supplementary European Search Report, completed Aug. 31, 2016 (EP10772932).

* cited by examiner

CORONA IGNITION WITH SELF-TUNING POWER AMPLIFIER

CROSS-REFERENCE TO RELATED APPLICATIONS

This application is a Continuation-in-Part and claims the benefit of U.S. Continuation-in-Part patent application Ser. No. 13/842,803, filed Mar. 15, 2013, which claims the benefit of U.S. patent application Ser. No. 12/777,105, filed May 10, 2010, which claims the benefit of U.S. provisional application No. 61/298,442, filed Jan. 26, 2010, and U.S. provisional application No. 61/176,614, filed May 8, 2009, the contents of which are hereby incorporated by reference.

BACKGROUND OF THE INVENTION

1. Technical Field

This invention relates generally to igniters used for igniting air/fuel mixtures in automotive application and the like, and in particular to a self-tuning power amplifier for use in a corona ignition system.

2. Related Art

U.S. Pat. No. 6,883,507 discloses an igniter for use in a corona discharge air/fuel ignition system. According to an exemplary method used to initiate combustion, an electrode is charged to a high, radio frequency ("RF") voltage potential to create a strong RF electric field in the combustion chamber. The strong electric field in turn causes a portion of the fuel-air mixture in the combustion chamber to ionize. The process of ionizing the fuel-air gas can be the commencement of dielectric breakdown. But the electric field can be dynamically controlled so that the dielectric breakdown does not proceed to the level of an electron avalanche which would result in a plasma being formed and an electric arc being struck from the electrode to the grounded cylinder walls or piston. The electric field is maintained at a level where only a portion of the fuel-air gas is ionized—a portion insufficient to create the electron avalanche chain reaction described previously which results in a plasma. However, the electric field is maintained sufficiently strong so that a corona discharge occurs. In a corona discharge, some electric charge on the electrode is dissipated through being carried through the gas to the ground as a small electric current, or through electrons being released from or absorbed into the electrodes from the ionized fuel-air mixture, but the current is very small and the voltage potential at the electrode remains very high in comparison to an arc discharge. The sufficiently strong electric field causes ionization of a portion of the fuel-air mixture to facilitate the combustion reaction(s). The ionized fuel-air mixture forms a flame front which then becomes self-sustaining and combusts the remaining fuel-air mixture.

FIG. 1 illustrates a capacitively coupled RF corona discharge ignition system. The system is termed "capacitively coupled" since the electrode 40 does not extend out of the surrounding dielectric material of the feedthru insulator 71b to be directly exposed to the fuel-air mixture. Rather, the electrode 40 remains shrouded by the feedthru insulator 71b and depends upon the electric field of the electrode passing through part of the feedthru insulator to produce the electric field in the combustion chamber 50.

FIG. 2 is a functional block diagram of the control electronics and primary coil unit 60 according to an exemplary embodiment of the invention. As shown in FIG. 2, the control electronics and primary coil unit 60 includes a center tapped primary RF transformer 20 which receives via line 62 a voltage of 150 volts, for example, from the DC source. A high power switch 72 is provided to switch the power applied to the transformer 20 between two phases, phase A and phase B at a desired frequency, e.g., the resonant frequency of the high voltage circuit 30 (see FIG. 1). The 150 volt DC source is also connected to a power supply 74 for the control circuitry in the control electronics and primary coil unit 60. The control circuitry power supply 74 typically includes a step down transformer to reduce the 150 volt DC source down to a level acceptable for control electronics, e.g., 5-12 volts. The output from the transformer 20, depicted at "A" in FIGS. 1 and 2, is used to power the high voltage circuit 30 which is housed in the secondary coil unit, according to an exemplary embodiment of the invention.

The current and voltage output from the transformer 20 are detected at point A and conventional signal conditioning is performed at 73 and 75, respectively, e.g., to remove noise from the signals. This signal conditioning may include active, passive or digital, low pass and band-pass filters, for example. The current and voltage signals are then full wave rectified and averaged at 77, 79, respectively. The averaging of the voltage and current, which removes signal noise, may be accomplished with conventional analog or digital circuits. The averaged and rectified current and voltage signals are sent to a divider 80 which calculates the actual impedance by dividing the voltage by the current. The current and voltage signals are also sent to a phase detector and phase locked loop (PLL) 78 which outputs a frequency which is the resonant frequency for the high voltage circuit 30. The PLL determines the resonant frequency by adjusting its output frequency so that the voltage and current are in phase. For series resonant circuits, when excited at resonance, voltage and current are in phase.

The calculated impedance and the resonant frequency are sent to a pulse width modulator 82 which outputs two pulse signals, phase A and phase B, each having a calculated duty cycle, to drive the transformer 20. The frequencies of the pulse signals are based on the resonant frequency received from the PLL 78. The duty cycles are based on the impedance received from the divider 80 and also on an impedance setpoint received from a system controller 84. The pulse width modulator 82 adjusts the duty cycles of the two pulse signals to cause the measured impedance from the divider 80 to match the impedance setpoint received from the system controller 84.

The system controller 84, in addition to outputting the impedance setpoint, also sends a trigger signal pulse to the pulse width modulator 82. This trigger signal pulse controls the activation timing of the transformer 20 which controls the activation of the high voltage circuit 30 and electrode 40 shown in FIG. 1. The trigger signal pulse is based on the timing signal 61 received from the master engine controller 86, not shown. The timing signal 61 determines when to start the ignition sequence. The system controller 84 receives this timing signal 61 and then sends the appropriate sequence of trigger pulses and impedance setpoint to the pulse width modulator 82. This information tells the pulse width modulator when to fire, how many times to fire, how long to fire, and the impedance setpoint. The desired corona characteristics (e.g., ignition sequence and impedance setpoint) may be hard coded in the system controller 84 or this information can be sent to the system controller 84 through signal 63 from the master engine controller 86. The system controller 84 may send diagnostics information to the master engine controller 86, as is customary in modern engine controls and ignition systems. Examples of diagnostic information may include under/over voltage supply, failure to fire as determined from the current and voltage signals, etc.

SUMMARY OF THE INVENTION

A power amplifier circuit that has an inductor and capacitor connected to one end of a secondary winding of an RF transformer is provided. The other end of the secondary winding is connected to a resistor that in turn is connected to ground. The transformer also has a primary winding with one end connected to a power supply. The other end of the primary winding is attached to switches. The windings are wound around a magnetic core. The primary winding is arranged so that current flowing from the power supply to the switches causes a magnetic flux in the core in opposing directions. To initiate oscillation of the circuit one of the switches is turned on briefly causing the inductor and capacitor to ring. As a result, a voltage is generated on the secondary winding and current sensor and fed to a circuit that filters out all noise and leaves a voltage at the natural frequency of the inductor capacitor. The current sensor includes at least one of a resistor, diode, an inductor, and a capacitor. This voltage is fed back to the switches, controlling on and off timing. In this way the need to measure and record natural frequency is eliminated.

In one embodiment of the invention, there is a power amplifier circuit for a corona ignition system, including an RF transformer with a primary winding and a secondary wound around a core; an inductor and capacitor connected to one end of the secondary winding; and a current sensor connected to another end of the secondary winding, wherein current induced in the secondary winding generates a magnetic flux in the core in opposing directions.

In one aspect of the invention, the primary winding has one end connected to a variable power supply, and the other end attached to first and second switches, such that the on and off timing of the first and second switches is controlled.

In another aspect of the invention, the secondary winding provides an output signal to a corona igniter.

In another aspect of the invention, ends of the secondary winding are respectively connected to two switches which drive the circuit to operate the corona ignition system, thereby igniting a corona igniter.

Another aspect of the invention provides an internal combustion engine including a cylinder head with an igniter opening extending from an upper surface to a combustion chamber containing a corona igniter. The engine also includes a control circuit configured to receive a signal from an engine computer; and a power amplifier circuit to generate an alternating current and voltage signal to drive an igniter assembly at its resonant frequency. The igniter assembly includes an inductor, capacitor and current sensor forming an LCR circuit with one end of the inductor connected through a firing end assembly to an electrode crown in the combustion chamber of the combustion engine.

In one aspect of the invention, the power amplifier circuit includes an RF transformer with a primary winding and a secondary winding each wound around a core; the inductor and capacitor connected at one end of the secondary winding; and the current sensor connected to another end of the secondary winding, wherein current induced in the secondary winding generates a magnetic flux in the core in opposing directions.

In another aspect of the invention, the control circuit determines a voltage to apply to the power amplifier circuit, the power amplifier circuit drives current through the windings and provides a feedback signal of the resonant frequency of the igniter assembly, and the igniter assembly resonates at a specified frequency when a capacitance at the capacitor, a resistance at the current sensor and an inductance at the inductor are combined.

In still another aspect of the invention, the primary winding has one end connected to a power supply and the other end attached to first and second switches, such that the first and second switches on and off timing are controlled.

In yet another aspect of the invention, the secondary winding provides an output signal to the corona igniter.

These and other features and advantages of this invention will become more apparent to those skilled in the art from the detailed description of example embodiments.

DETAILED DESCRIPTION OF EXAMPLE EMBODIMENTS

A power amplifier circuit that has an inductor and capacitor connected to one end of the output winding of an RF transformer. The other end of the output winding is connected to a current sensor that in turn is connected to ground. The current sensor includes at least one of a resistor diode, an inductor, and a capacitor. The transformer has two primary windings. Both primary windings have one end connected to a variable DC voltage supply. The other end of each primary winding is attached to a MOSFET. All three windings are wound around a ferrite core. The two primary windings are arranged so that current flowing from the DC voltage supply to the MOSFET causes a magnetic flux in the ferrite core in opposing directions. To initiate oscillation of the circuit one of the MOSFETs is turned on briefly causing the inductor and capacitor to ring. As a result, a voltage is generated on the secondary winding current sensor that is fed to a circuit that filters out all noise and leaves a voltage at the natural frequency of the inductor capacitor. This voltage is fed back to the MOSFETs, controlling on and off timing. In this way the need to measure and record natural frequency is eliminated.

Figure 1:
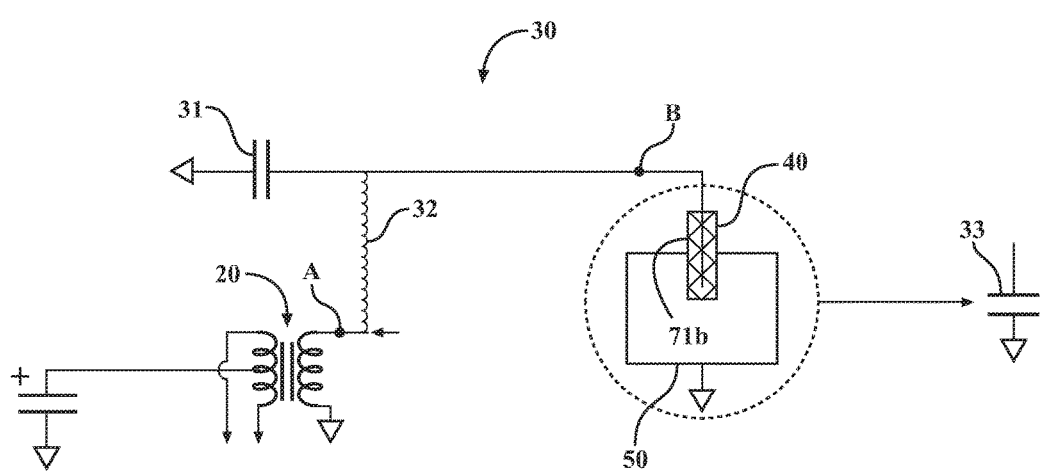
FIG. 1 illustrates an exemplary corona discharge ignition system in the prior art.
Figure 2:
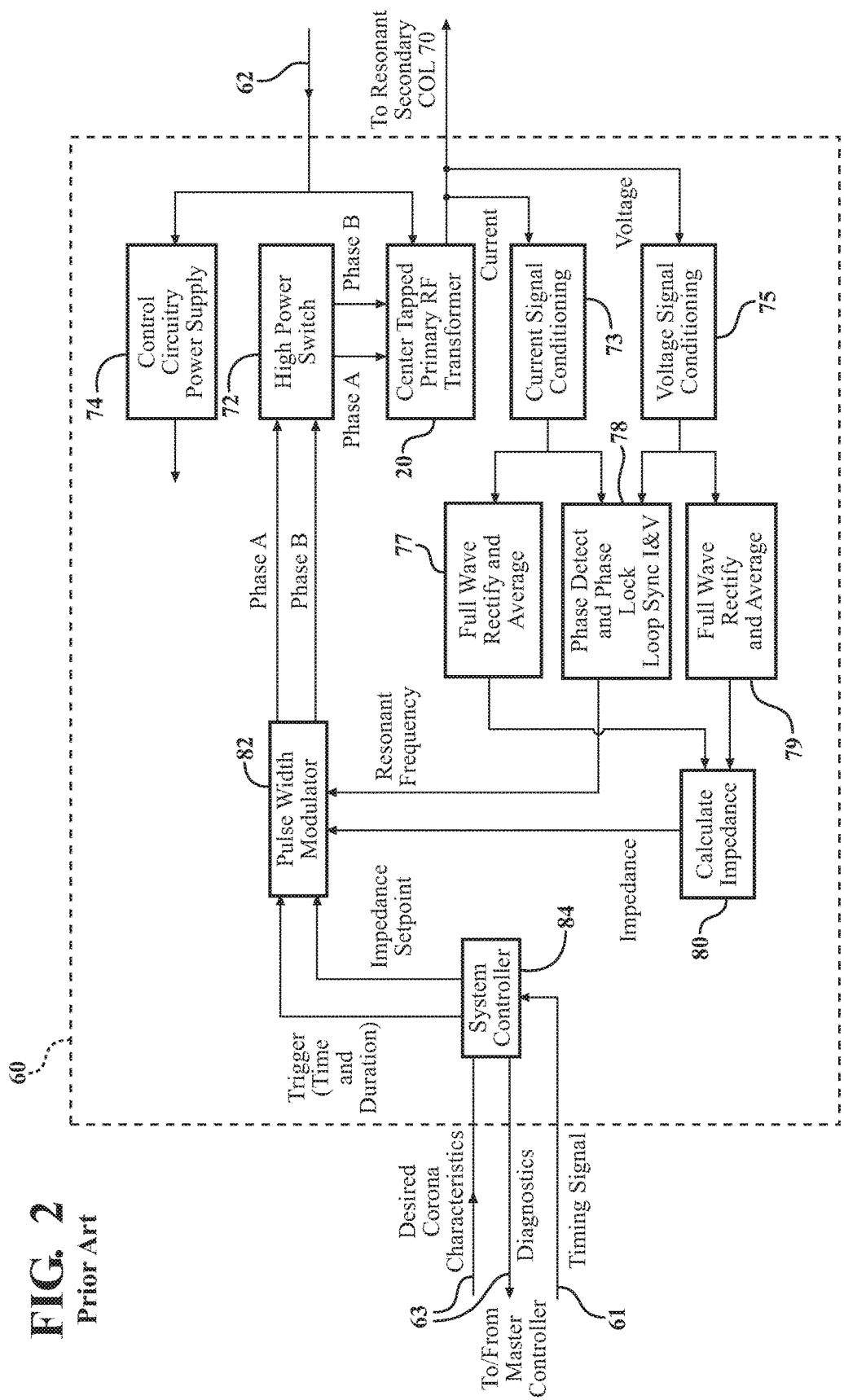
FIG. 2 shows a functional block diagram of the control electronics and primary coil unit in accordance with the prior art system.
Figure 3:
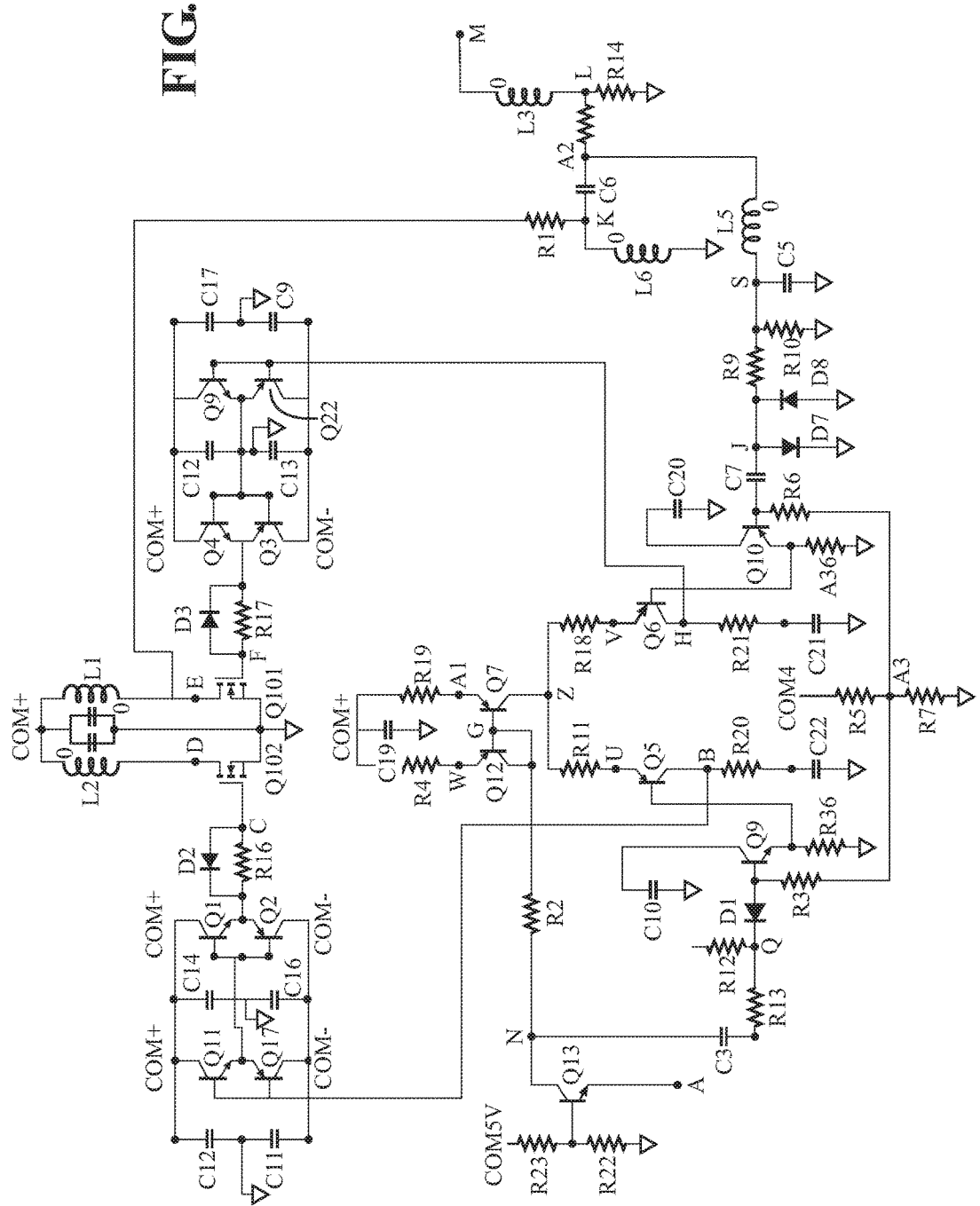
FIG. 3 illustrates a self-tuning circuit in accordance with the invention.

The circuit illustrated in FIG. 3 includes a transformer, mosfets to drive the transformer, and a feedback circuit to tune the frequency of operation of the transformer. The transformer has, in one example, a ferrite core with four sets of windings around the core. Inductors L1 and L2 are the primary windings, which are joined together at a point that is connected to a DC voltage supply. The circuit can be designed to operate with a range of voltage supply voltages, in this embodiment the voltage will be set to 60 VDC. The other ends of inductors L1 and L2 are each connected to a switch, which is shown as a MOSFET. Other types of switches may be used, as readily understood by the skilled artisan. Each switch can also be referred to as oscillator.

Inductor L3 is the secondary or output inductor of the transformer. One end of L3 is connected through a low value resistance. The other end is connected to the inductor of a corona igniter. The fourth inductor, L6, is a sense inductor which provides a feedback signal to compensate for the varying capacitance of different length attachment cables.

The ignition system is comprised of three sub-assemblies: a control circuit, a power amplifier and an igniter assembly.

Control circuit: This circuit receives a signal from the engine computer (ECU) that tells the system when to start and end corona in the cylinder. This circuit determines what voltage to apply to the power amplifier transformer. Part of this circuit generates the DC voltage that is applied to the power amplifier transformer.

Power amplifier circuit: This circuit generates an alternating current and voltage signal to drive the igniter assembly at its resonant frequency. It receives a command from the control circuit to begin and end oscillation. The power amplifier circuit includes circuits to drive current through a transformer and a circuit to feed back the resonant frequency of the igniter assembly. This feedback signal includes a signal related to inductor resonance, a signal related to primary winding voltage, and a feedback signal related to the secondary winding voltage.

Igniter assembly: The igniter assembly attaches to the cylinder head in a manner similar to a spark plug. The assembly includes an inductor and a firing end subassembly which includes an electrode inside the combustion chamber. The igniter assembly has an inductor, capacitor and current sensor wired together as an LCR assembly. When a voltage is applied to one end of the inductor the LCR assembly resonates. The inductor is part of the igniter. The second end of the inductor is connected through a firing end assembly to an electrode crown in the combustion chamber. The firing end assembly and the combustion chamber form a capacitance and resistance that when combined with the inductance resonate at a specific frequency.

In operation, a device such as the engine computer (ECU) sends a signal to the control circuit. This signal tells the control circuit when to start and end corona on each igniter. The control circuit sends a normally high signal to the power amplifier that goes low to start the corona event. The signal stays low for as long as corona is desired, and returns high to end the corona event. This signal is applied to node A which is the emitter of Q13. This change in the voltage at A causes node N to go from high to low. Node N is then sent to two places.

One destination is the collector of Q12 and the bases of Q12 and Q7. This drop at N causes Q12 and Q7 to turn on, allowing current to flow to node Z. The second destination is C3, which sends a brief voltage drop through R13 and diode 1 to node R, the base of Q9. This in turn briefly drops the voltage at node T. This dip in the base turns Q5 on, drawing current from node Z, and raising node B from negative to positive. This turns Q11 on and Q17 off, which causes Q1 to turn on and Q2 to turn off. This pulls their emitters up, which are connected through R16 and diode 2 to node C, the gate of M1. Node C goes from negative to positive, turning M1 on. The drain of M1 is connected to L2, and its source is connected to ground. Turning on M1 causes current to flow through L2, which in turn induces a magnetic flux to flow through the ferrite inside the transformer.

As M1 continues to stay on, current is conducted through L2, until the voltage at node T returns to a value that shuts Q5 off. This causes the current flowing through node Z to transfer from R11 into R18, raising node H from negative to positive. This turns Q8 on and Q20 off which causes Q4 to turn on and Q3 to turn off. This pulls their emitters up, which are connected through R17 and diode 3 to node F, the gate of M4. Node F goes from negative to positive, turning M4 on. Turning on M4 causes current to flow through L1, which in turn induces a magnetic flux to flow in the opposite direction to the flux caused by L2, through the ferrite inside the transformer.

The transformer ferrite magnetic flux generates a current through the transformer secondary winding L3 that in turn creates a voltage across its two ends. One end of L3 is connected to R14 which is attached to ground. The other end of L3 is attached to the inductor in the igniter assembly. The rapidly changing voltage applied to the igniter LCR assembly induces it to resonate. When current flows through R14 the voltage at node L rises. This voltage is fed through R15 into node A2. The current from node A2 goes through L5, which is connected to C5 and R19. These components form a low pass filter and provide a phase shift in the current of less than 180°, and remove frequencies outside the range of interest. This signal is clipped by D7 and D8, and then passed through C7 to drive Q10. When Q10 is turned on, current flows through R18 and stops flowing through R11. This switches M1 off and M4 on, and vice versa.

Figure 4:
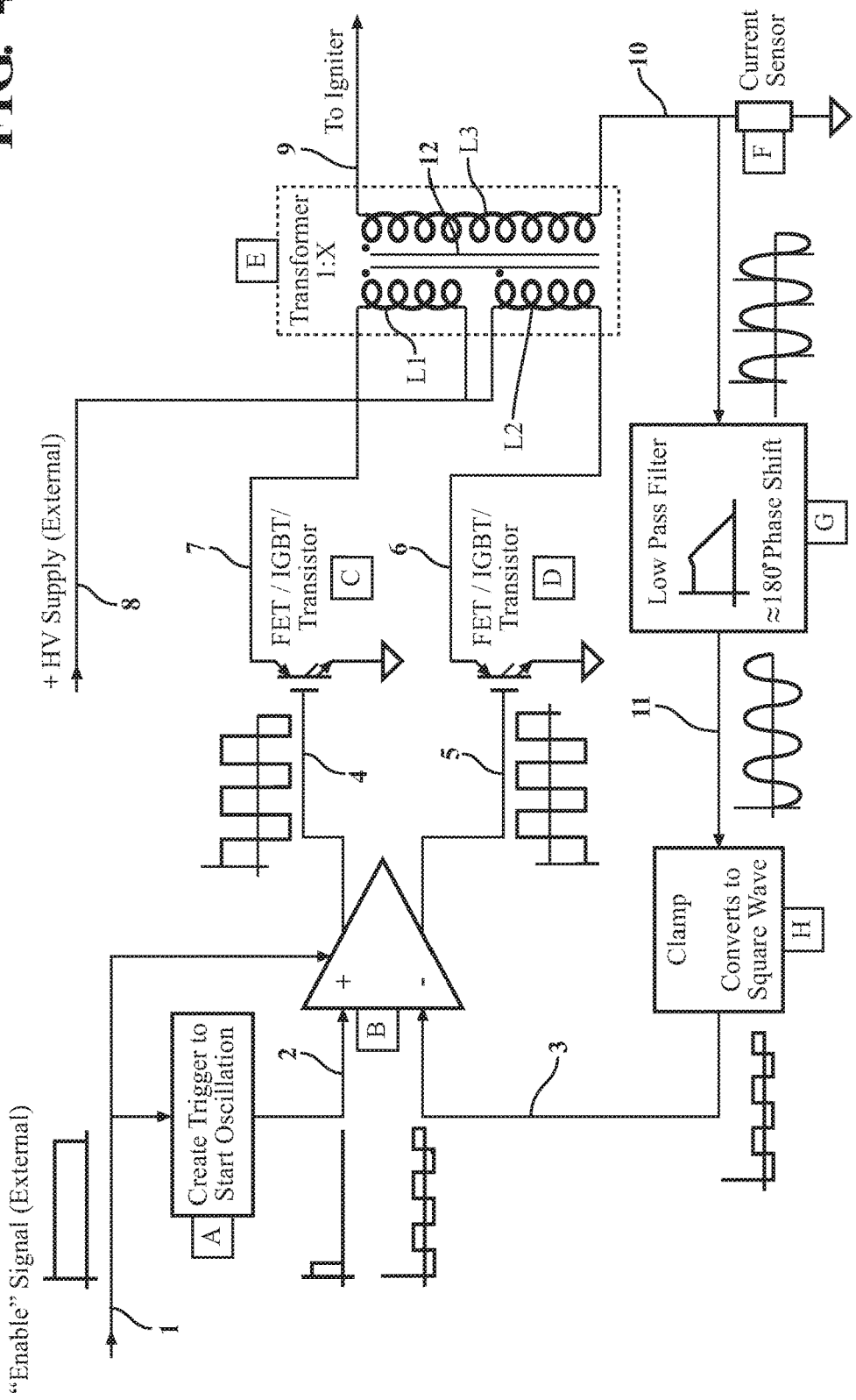
FIG. 4 is a block diagram illustrating implementation of the circuit of FIG. 3 in a corona ignition system according to one example embodiment.

FIG. 4 illustrates an implementation of the circuit of FIG. 3 in a corona ignition system according to one example embodiment. The system of FIG. 4 includes a pulse generator A, a comparator block B, switches C and D, a transformer E, a current sensor F, a low pass filter G, and a clamp H. The corona igniter (not shown) is connected to the transformer E.

Operation of the system is initiated by a command signal or "enable signal" 1 asserted by an external source, such as an engine control unit. The "enable signal" 1 corresponds to point A in the circuit of FIG. 3. The "start" pulse generator A receives the enable signal 1 and transmits a non-inverting output 2 which initiates oscillation of the current flowing through the system and through the corona igniter in response to the enable signal 1. The pulse generator A corresponds to components C3, R13, R12, and D1 of the circuit of FIG. 3.

The comparator block B receives the enable signal 1, as well as the non-inverting input 2 from the pulse generator A, and an inverting input 3 from the low pass filter G and clamp H. The signal received by the inverting input 3 of the comparator block B represents the phase of the current of the corona igniter. The non-inverting input 2 corresponds to Q9 and the inverting input 3 corresponds to Q10 of FIG. 3. The comparator block B then creates control signals for the switches C and D. The control signals provided by the comparator block B are based on information in the enable signal 1, the non-inverting input 2, and the inverting input 3. The inverting input 3 is also referred to as a feedback signal from the low pass filter G and the clamp H. The comparator block B provides the control signals to the switches C and D as a normal output 4 and an inverted output 5. The normal output 4 corresponds to point H and the inverted output 5 corresponds to point G of FIG. 3. The outputs 5 and 4 of the comparator block B also correspond to Q5 and Q6 of FIG. 3.

The switches C and D receive the normal output 4 and the inverted output 5. The first switch C receives the normal output 4 and the second switch D receives the inverted output 5. The first switch C corresponds to Q3, Q4, Q9, Q22, and Q101 FIG. 3, and the second switch D corresponds to Q1, Q2, Q11, Q17, and Q102. In response to the outputs 4 and 5, the switches C and D each apply a voltage through signals 6 and 7 to the transformer E, which is connected to the corona igniter through output 9, and thus causes oscillation of the current of the corona igniter.

The transformer E receives the voltage from the switches C and D and, in addition to causing oscillation of the corona igniter, the transformer E also increases the drive voltage of the corona igniter. When the circuit is on, voltage is applied from the transformer E to the corona igniter at all times. A positive voltage should be applied whenever current flows into the corona igniter, and a negative voltage should be applied whenever current flows out of the corona igniter. Switching from positive to negative or back should occur as close to zero current as possible. In one possible scheme, the transformer E has three windings wound around a magnetic core 12, corresponding to L1, L2, and L3 of FIG. 3. There are two primary windings L1 and L2 which each have one end attached to the power supply and the other end attached to one of the switches C, D; and one secondary winding which has one end attached to the corona igniter and the other attached to the current sensor F. L1 and L2 are arranged with switches C and D such that they create opposing magnetic fields in the magnetic core 12 when energized. The voltage output created by the transformer E is a balanced square wave output, symmetrical about zero.

The current sensor F of the system receives the current at the output of the transformer E through signal 10 and measures the current at the output of the transformer E, which is also the current of the corona igniter. The current sensor F includes at least one of a resistor, diode, an inductor, and a capacitor. The current sensor F of FIG. 3 is a resistor located at R14. The current measurement obtained by the current sensor F is ultimately used to control the voltage of the secondary winding L3, such that the voltage of the secondary winding is "in phase" with the current of the corona igniter. The term "in phase" means that the voltage and the current peak at the same time, which means that the corona igniter is operating at the resonant frequency. More specifically, the block comparator B uses the information obtained by the current sensor F to instruct the switches C, D to apply a voltage to the primary windings of the transformer E at a certain time. The voltage applied to the primary windings L1, L2 is timed such that it causes the secondary winding L3 to have a voltage in phase with the current of the corona igniter.

More specifically, when current is transmitted from the transformer E and into the corona igniter, the current being transmitted to the corona igniter is sensed by the current sensor F. In response, the current sensor F transmits a signal, ultimately to the second switch D, to apply a positive voltage, and thus push more current from the transformer E into the corona igniter. The signal from the current sensor F to the switch D indicates the time at which the current being transmitted to the igniter goes through zero. The switch D turns on, causing the transformer E to provide the positive voltage, and thus provide more current, to the corona igniter, precisely when the current flowing into the corona igniter is at or about zero. Switching from positive to negative voltage or back should occur as close to zero current as possible.

Likewise, when current is traveling out of the corona igniter, through the transformer E and to ground, the current traveling out of the corona igniter is also sensed by the current sensor F. In response, the current sensor F transmits a signal, ultimately to the first switch C, causing the switch to close and apply a negative voltage, and thus pull more current, out of the corona igniter. The signal from the current sensor F to the switch C indicates the time at which the current traveling out of the igniter goes through zero. The switch C in turn closes, causing the transformer E to apply a negative voltage, and thus pull more current from the corona igniter, precisely when the current traveling out of the corona igniter is at or about zero.

Switching between transmitting current to the corona igniter and pulling current from the corona igniter at a time when the current is nominally at zero allows the system to operate at resonant frequency. In the example of FIGS. 3 and 4, when the current is traveling to the corona igniter, the voltage at the current sensor is negative, and when the current is traveling out of the corona igniter, the voltage at the current sensor is positive. In addition, R1, L6, and C6 of FIG. 3 compensate for the length of a cable between the circuit and corona igniter.

The low pass filter G of the system receives a voltage signal representing the current from the transformer E and removes or filters unwanted frequencies or frequencies outside of the range of interest. The low pass filter G also creates a phase shift in the current of at least 120° but less than 180°. As alluded to above, the low pass filter G also provides the feedback signal ultimately to the comparator block B, which includes the phase of the current of the corona igniter, indicating whether the current is positive, negative, or at zero. The low pass filter G corresponds to L5, C5, R9, and R10 of FIG. 3.

The clamp H receives the feedback signal from the low pass filter G and truncates the signal before transmitting the feedback signal, i.e. inverting input 3, to the comparator block B. The feedback signal provided to the comparator block B provides for zero crossing current detection only. In FIG. 3, the clamp H is located at D7 and D8.

The operation of the system and signals sent between the components of the system will now be described in more detail. Initially, before operation of the system begins by the enable signal 1 being transmitted to the comparator block B, the comparator block B is disabled, and the normal output 4 and the inverted output 5 are off. At this point an HV power supply 8 is enabled and ready to provide power to the transformer E. The HV power supply 8 is external to the system. In FIG. 3, the HV power supply is connected to COM+. However, no current flows in the transformer E before operation of the system begins.

As indicated above, operation of the system begins by the enable signal 1 supplying power to the comparator block B. The enable signal 1 also causes the pulse generator A to generate the non-inverting input 2, which includes a short pulse that forces the comparator block B out of balance. This causes the normal output 4 to briefly enable the first switch C, which causes current to flow from the HV power supply 8 through the primary winding of the transformer E and to signal 7. The output 9 of the transformer E is driven negative and current continues to flow through the transformer E and the current sensor F to ground.

The current flowing through the transformer E and the current sensor F to ground causes the voltage to rise at signal 10, reflecting the current flow of the corona igniter. However, the voltage at signal 10 includes high frequency components due to charging and discharging of parasitic capacitance in the system, particularly in the connecting cables. The filter block G removes these unwanted frequencies and provides the phase shift. The phase shift is at least 120°, and it is preferably close to but less than 180°. Therefore, the low pass filter G provides a clean sinusoidal current signal at 11, reflecting but almost in antiphase with the current of the corona igniter. A further 180° phase shift is provided by using the inverting input 3 of the comparator block B. An unavoidable delay in the comparator block B and switches C and D make for a total phase shift of 360°. This is a condition required for stable oscillation.

The clamp H clips the size of the current signal 11 and converts the signal 11 to a square wave. This square wave is fed to the inverting input 3, i.e. feedback signal, and to the comparator block B. The phase shift causes the inverting input 3 provided to the negative input of comparator block B to be a positive feedback around the entire loop. The positive feedback is a condition required for oscillation of the system and the corona igniter.

At this point, due to the resonant LC action of the corona igniter attached to the transformer E through signal 9, the current flowing through signal 9 into the corona igniter peaks, drops back to zero, and then passes through zero. This causes the voltage at the signal 10 from the transformer E to the current sensor F to reverse its sign. The reverse signal causes the comparator block B to change state of the normal output 4 and the inverted output 5, swapping the conductance from the first switch C to the second switch D, and reversing the current flow through the system. The current drives the other way, generating a negative half wave at the signal 10. This process continues until the "enable" signal 1 is removed.

After the first cycle, steady state operation is attained, and the short pulse from the pulse generator A provided in the non-inverting input 2 is finished, and the voltage at the non-inverting input 2 is at quiescent level. The voltage at the inverting input 3 describes a small amplitude square wave around the quiescent level, and the small amplitude square wave is in antiphase with the current in the corona igniter.

The phasing of the current and applied voltage, through the switches C, and D and transformer E forces the current and voltage of the corona igniter to be in phase. This provides the condition needed for resonance of a series LC circuit, such as the corona igniter, which is a series LC circuit. According, implementation of the circuit of FIG. 3, according to the system of FIG. 4, enforces operation of the corona igniter at resonant frequency, and forces the corona ignition system to operate at the resonant frequency of the corona igniter.

Figure 5:
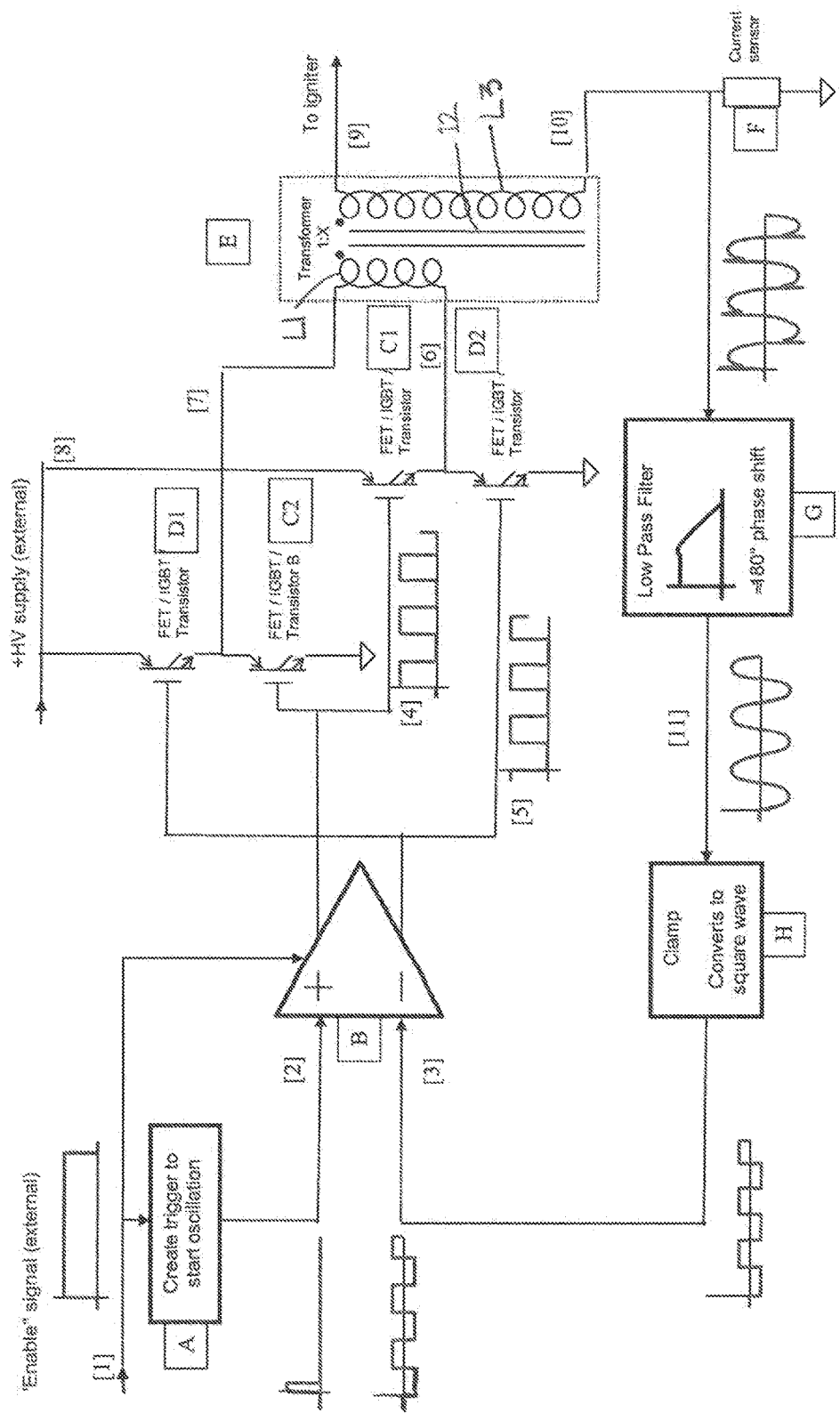
FIG. 5 is a block diagram illustrating implementation of the circuit of FIG. 3 in a corona ignition system according to another example embodiment.

FIG. 5 illustrates an implementation of the circuit of FIG. 3 in a corona ignition system according to another example embodiment. The system of FIG. 5 is referred to as an analogue implementation and full bridge. Like the system of FIG. 4, the system of FIG. 5 also includes a pulse generator A, a comparator block B, switches C1, C2, D1, D2, a transformer E, a current sensor F, a low pass filter G, and a clamp H. The corona igniter (not shown) is connected to the transformer E.

In the system of FIG. 5, the switches C1, C2, D1, D2 are pairs of FETs, here diagonally opposite pairs, which are activated to connect opposite ends of a single primary winding L1 to Vin and ground in turn. For example, the top right/bottom left pair of switches will allow current to flow from top to bottom of the primary winding L1; and the bottom right/top left pair of switches provide current in the opposite direction. Also, in this system, the capacitor C on the side of the primary winding L1 is optional. The advantages of the system of FIG. 5 include a simpler transformer E due to better use of the core 12. In addition, only Vin appears across the FETs, and thus better and cheaper FETs can be used. Also, a single FET failure does not lead to short circuit. Further, energy trapped in leakage inductance can be safely directed back into the primary winding L1.

Operation of the system is initiated by a command signal or "enable signal" 1 asserted by an external source, such as an engine control unit. The "enable signal" 1, also referred to as a command signal, corresponds to point A in the circuit of FIG. 3. The "start" pulse generator A is used to initiate oscillation when the enable signal 1 is asserted. The "start" pulse generator A receives the enable signal 1 and transmits a non-inverting output 2 which initiates oscillation of the current flowing through the system and through the corona igniter in response to the enable signal 1. The pulse generator A corresponds to components C3, R13, R12, and D1 of the circuit of FIG. 3.

The comparator block B receives the enable signal 1 and provides complimentary outputs, which correspond to Q12, Q7, Q5, Q6, Q9, and Q10 of FIG. 3. The comparator block B then creates control signals for switching based on the enable signal 1 and feedback signals. More specifically, the comparator block B receives the enable signal 1, as well as the non-inverting input 2 from the pulse generator A, and an inverting input 3 from the low pass filter G and clamp H. The signal received by the inverting input 3 of the comparator block B represents the phase of the current of the corona igniter. The non-inverting input 2 corresponds to the input of Q9 (Q9b) and the inverting input 3 corresponds to the input of Q10 of FIG. 3. The comparator block B then creates control signals for the switches C1, C2, D1, D2. The control signals provided by the comparator block B are based on information in the enable signal 1, the non-inverting input 2, and the inverting input 3. The inverting input 3 is also referred to as a feedback signal from the low pass filter G and the clamp H. The comparator block B provides the control signals to the switches C1, C2, D1, D2 as a normal output 4 and an inverted output 5. The normal output 4 corresponds to point H and the inverted output 5 corresponds to point B of FIG. 3. The outputs 5 and 4 of the comparator block B also correspond to Q5 and Q6 of FIG. 3. The enable signal 1 also corresponds to G of FIG. 3.

The system of FIG. 5 includes two pairs of switches, including first switches C1, C2, and second switches D1, D2, which apply voltage to the transformer E to produce oscillation of the corona igniter. The first switches C1 and C2 turn on as a pair while the second switches D1, D2 are off, and vice versa. For example, switch C1 receives the normal output 4 and switch D1 receives the inverted output 5. Alternatively, switch C2 receives the normal output 4 and switch D2 receives the inverted output 5. In response to the outputs 4 and 5, the switches C1 and D1 or C2 and D2 each apply a voltage through signals 6 and 7 to the transformer E, which is connected to the corona igniter through output 9, and thus cause oscillation of the current of the corona igniter.

The transformer E increases the drive voltage and creates a balance square wave output, symmetrically about zero. The transformer E also includes a single primary winding, corresponding to L1 of FIG. 5, and a single secondary winding, corresponding to L3 of FIG. 5, for one possible compensation scheme. The transformer E with the single primary winding L1 of FIG. 5 is unlike the transformer E of FIG. 4 which includes two primary windings L1, L2, and one secondary winding L3. More specifically, the transformer E of FIG. 5 receives the voltage from the switches C1, C2, D1, D2, and, in addition to causing oscillation of the corona igniter, the transformer E also increases the drive voltage of the corona igniter. When the circuit is on, voltage is applied from the transformer E to the corona igniter at all times. A positive voltage should be applied whenever current flows into the corona igniter, and a negative voltage should be applied whenever current flows out of the corona igniter. Switching from positive to negative or back should occur as close to zero current as possible. In this example, the transformer E has one primary winding L1 wound around a magnetic core 12. The primary winding L1 has one end attached alternately to the power supply or ground through switches D1 and C2, the other end of the primary winding L1 is attached alternately to the power supply or ground through switches C1 and D2. One secondary winding L3 which has one end attached to the corona igniter and the other attached to the current sensor F. As indicated above, the voltage output created by the transformer E is a balanced square wave output, symmetrical about zero.

The current sensor F of the system of FIG. 5 measures current in the output of the transformer E and hence the corona igniter. The current sensor F also controls switching to give resonant operation. More specifically, the current sensor F receives the current at the output of the transformer E through signal 10 and measures the current at the output of the transformer E, which is also the current of the corona igniter. The current sensor F includes at least one of a resistor, diode, an inductor, and a capacitor. The current sensor F of FIG. 3 is a resistor located at R14. The current measurement obtained by the current sensor F is ultimately used to control the voltage of the secondary winding L3, such that the voltage of the secondary winding is "in phase" with the current of the corona igniter. The term "in phase" means that the voltage and the current peak at the same time, which means that the corona igniter is operating at the resonant frequency. More specifically, the block comparator B uses the information obtained by the current sensor F to instruct the switches C1, C2, D1, D2, to apply a voltage to the primary winding L1 of the transformer E at a certain time. The voltage applied to the primary winding L1 is timed such that it causes the secondary winding L3 to have a voltage in phase with the current of the corona igniter.

Even more specifically, when current is transmitted from the transformer E and into the corona igniter, the current being transmitted to the corona igniter is sensed by the current sensor F. In response, the current sensor F transmits a signal, ultimately to the second switch D1 or D2, to apply a positive voltage, and thus push more current from the transformer E into the corona igniter. The signal from the current sensor F to the switch D1 or D2 indicates the time at which the current being transmitted to the igniter goes through zero. The switch D1 or D2 turns on, causing the transformer E to provide the positive voltage, and thus provide more current, to the corona igniter, precisely when the current flowing into the corona igniter is at or about zero. Switching from positive to negative voltage or back should occur as close to zero current as possible.

Likewise, when current is traveling out of the corona igniter, through the transformer E and to ground, the current traveling out of the corona igniter is also sensed by the current sensor F. In response, the current sensor F transmits a signal, ultimately to the first switch C1 or C2, causing the switch to close and apply a negative voltage, and thus pull more current, out of the corona igniter. The signal from the current sensor F to the switch C1 or C2 indicates the time at which the current traveling out of the igniter goes through zero. The switch C1 or C2 in turn closes, causing the transformer E to apply a negative voltage, and thus pull more current from the corona igniter, precisely when the current traveling out of the corona igniter is at or about zero.

Switching between transmitting current to the corona igniter and pulling current from the corona igniter at a time when the current is nominally at zero allows the system to operate at resonant frequency. In the example of FIGS. 3 and 5, when the current is traveling to the corona igniter, the voltage at the current sensor F is negative, and when the current is traveling out of the corona igniter, the voltage at the current sensor F is positive. In addition, R1, L6, and C6 of FIG. 3 compensate for the length of a cable between the circuit and corona igniter.

The low pass filter G of the system of FIG. 5 removes frequencies outside the range of interest and creates a phase shift in the feedback signal. More specifically, the low pass filter G receives a voltage signal representing the current from the transformer E and removes or filters unwanted frequencies or frequencies outside of the range of interest. The low pass filter G also creates a phase shift in the current of at least 120° but less than 180°. As alluded to above, the low pass filter G also provides the feedback signal ultimately to the comparator block B, which includes the phase of the current of the corona igniter, indicating whether the current is positive, negative, or at zero. The low pass filter G corresponds to an L5, C5, R10, and R9 of FIG. 3.

The clamp H of the system of FIG. 5 reduces the amplitude of the feedback signal for zero crossing detection only. Initially, the comparator block B is disabled, and the normal output 4 and the inverted output 5 are off. The HV supply 8 is already enabled, and no current flows through the transformer E. During operation, the clamp H receives the feedback signal from the low pass filter G and truncates the signal before transmitting the feedback signal, i.e. inverting input 3, to the comparator block B. The feedback signal provided to the comparator block B provides for zero crossing current detection only. In FIG. 3, the clamp H of this system is located close to node J and C7.

The operation of the system and signals sent between the components of the system will now be described in more detail. Initially, before operation of the system begins by the enable signal 1 being transmitted to the comparator block B, the comparator block B is disabled, and the normal output 4 and the inverted output 5 are off. At this point an HV power supply 8 is enabled and ready to provide power to the transformer E. The HV power supply 8 is external to the system. In FIG. 3, the HV power supply is connected to COM+. However, no current flows in the transformer E before operation of the system begins.

As indicated above, operation of the system begins by the enable signal 1 supplying power to the comparator block B. The enable signal 1 also causes the pulse generator A to generate the non-inverting input 2, which includes a short pulse that forces the comparator block B out of balance. This causes the normal output 4 to briefly enable the first switch C1 or C2, which causes current to flow from the HV power supply 8 to signals 6 and 7 and through the primary winding L1 of the transformer E. The output 9 of the transformer E is driven negative and current continues to flow from the output 9 through the transformer E and the current sensor F to ground.

The current flowing through the transformer E and the current sensor F to ground causes the voltage to rise at signal 10, reflecting the current flow of the corona igniter. However, the voltage at signal 10 includes high frequency components due to charging and discharging of parasitic capacitance in the system, particularly in the connecting cables. The filter block G removes these unwanted frequencies and provides the phase shift. The phase shift is at least 120°, and it is preferably close to but less than 180°. Therefore, the low pass filter G provides a clean sinusoidal current signal at 11, reflecting but almost in antiphase with the current of the corona igniter. A further 180° phase shift is provided by using the inverting input 3 of the comparator block B. An unavoidable delay in the comparator block B and switches C1, C2, D1, D2 make for a total phase shift of 360°. This is a condition required for stable oscillation.

The clamp H clips the size of the current signal 11 and converts the signal 11 to a square wave. This square wave is fed to the inverting input 3, i.e. feedback signal, and to the comparator block B. Because of the 180° phase shift, the inverting input 3 provided to the negative input of comparator block B is a positive feedback around the entire loop. The positive feedback is a condition required for oscillation of the system and the corona igniter.

At this point, due to the resonant LC action of the corona igniter attached to the transformer E through signal 9, the current flowing through signal 9 into the corona igniter peaks, drops back to zero, and then passes through zero. This causes the voltage at the signal 10 from the transformer E to the current sensor F to reverse its sign. The reverse signal causes the comparator block B to change state of the normal output 4 and the inverted output 5, swapping the conductance from the first switch C1 or C2 to the second switch D1 or D2, and reversing the entire process, with current flowing from the HV power supply 8 to signal 7 and signal 6. The current drives the other way, generating a negative half wave at the signal 10. This process continues until the "enable" signal 1 is removed.

After the first cycle, steady state operation is attained, and the short pulse from the pulse generator A provided in the non-inverting input 2 is finished, and the voltage at the non-inverting input 2 is at quiescent level. The voltage at the inverting input 3 describes a small amplitude square wave around the quiescent level, and the small amplitude square wave is in antiphase with the current in the corona igniter.

The phasing of the current and applied voltage, through the switches C1, C2, D1, D2, and transformer E, means that, looking into the corona igniter at the output 9, current and voltage of the corona igniter are forced to be in phase. This provides the condition needed for resonance of a series LC circuit, such as the corona igniter, which is a series LC circuit. Accordingly, implementation of the circuit of FIG. 3, according to the system of FIG. 5, enforces operation of the corona igniter at resonant frequency, and forces the corona ignition system to operate at the resonant frequency of the corona igniter.

Variations and modifications to the disclosed embodiment may become apparent to those skilled in the art and do come within the scope of the invention. Accordingly, the scope of legal protection afforded this invention can only be determined by studying the following claims.

The invention claimed is:

1. A power amplifier circuit for a corona ignition system, comprising:
   an RF transformer with a primary winding and a secondary winding, the primary winding and the secondary winding being wound around a magnetic core;
   an inductor and capacitor connected to one end of the secondary winding; and
   a current sensor connected to another end of the secondary winding, wherein
   current through the secondary winding generates a magnetic flux in the core in opposing directions.

2. The power amplifier of claim 1, wherein the primary winding has one end connected to a power supply, and the other end attached to first and second switches, such that the first and second switches on and off timing are controlled.

3. The power amplifier of claim 2, wherein the secondary winding provides an output signal to a corona igniter.

4. The power amplifier of claim 1, wherein the current sensor is at least one of a resistor, diode, an inductor, and a capacitor.

5. The power amplifier of claim 1 including a corona igniter having a resonant frequency, an oscillator, and a low pass filter, wherein the low pass filter provides a phase shift in the current of at least 120° and less than 180° and filters unwanted frequencies and provides a filtered feedback signal to sustain the oscillator at the resonant frequency of the corona igniter.

6. A corona ignition system, comprising:
   a primary winding having one end receiving power form a power supply;
   a pair of switches each connected to the other end of the primary winding for applying a voltage to the primary winding;
   a secondary winding disposed around the magnetic core in a direction opposite the primary winding and having one end connected to a corona igniter;
   a current sensor connected to the other end of the secondary winding and ultimately connected to the switches, the current sensor obtaining the current of the secondary winding and using the current of the secondary winding to ultimately instruct the switches to apply the voltage to the primary winding at a time causing the voltage of the secondary winding to be in phase with the current of the corona igniter.

7. The corona igniter of claim 6 including a comparator block for receiving a signal representing the current obtained from the current sensor and instructing the switches to apply the voltage to the primary winding at a time causing the voltage of the secondary winding to be in phase with the current of the corona igniter.

8. The corona ignition system of claim 7 including a low pass filter for receiving a signal representing the current from the current sensor and removing unwanted frequencies from the current and creating a phase shift in the current signal of at least 120° and less than 180° prior to transmitting the signal ultimately to the comparator block.

9. The corona ignition system of claim 8 including a clamp receiving a signal representing the current from low pass filter and truncating the signal prior to transmitting the signal to the comparator block.

10. A method of operating a corona igniter a resonant frequency, comprising the steps of:
    obtaining a current from a secondary winding connected to a corona igniter, the current of the secondary winding indicating the current of the corona igniter, and the secondary winding being connected to a primary winding; and
    instructing switches to apply a voltage to the primary winding at a time causing a voltage of secondary winding to be in phase with the current of the corona igniter.

11. The method of claim 10 including transmitting a signal representing the current to a comparator block, and wherein the comparator block instructs the switches to apply the voltage to the primary winding.

12. The method of claim 11 including removing unwanted frequencies from the signal representing the current and creating a phase shift in this signal of at least 120° and less than 180° prior to transmitting to the comparator block.

13. The method of claim 12 including truncating the signal representing the current prior to transmitting this signal to the comparator block.

14. The method of claim 10 wherein the step of obtaining current from the secondary winding includes detecting current traveling into the corona igniter; and applying a positive voltage to the corona igniter when the current traveling into the corona igniter is nominally at zero.

15. The method of claim 10 wherein the step of obtaining current from the secondary winding includes detecting current traveling out of the corona igniter; and applying a negative voltage to the corona igniter when the current traveling out of the corona igniter is nominally at zero.

16. A power amplifier circuit, comprising:
an RF transformer including a primary winding and a secondary winding each being wound around a core, the secondary winding including a resistor;
the primary winding having one end connected to a power supply and the other end of attached to switches, wherein current flows from the DC voltage supply to the switches;
an inductor and a capacitor connected to one end of the secondary winding of the RF transformer;
a resistor connected to the other end of the secondary winding and connected to ground;
wherein current flowing from the DC voltage supply to the switches causes a magnetic flux in the core and causes a voltage to be generated on the resistor of the secondary winding, wherein this voltage is fed back to the switches to control on and off timing of the switches.

17. A method of operating a power amplifier circuit, comprising:
providing an RF transformer including a primary winding an a secondary winding each being wound around a core, the secondary winding including a resistor, and the primary winding having one end connected to a power supply and the other end attached to switches, wherein current flows from the DC voltage supply to the switches;
providing an inductor and a capacitor connected to one end of the secondary winding of the RF transformer;
providing a resistor connected to the other end of the secondary winding and connected to ground;
transmitting current from the DC voltage supply to the switches to cause a magnetic flux in the core and cause a voltage to be generated on the resistor of the secondary winding; and
feeding the voltage generated on the resistor of the secondary winding back to the switches to control on and off timing of the switches.

* * * * *